United States Patent [19]

Van Rumpt et al.

[11] Patent Number: 4,712,073
[45] Date of Patent: Dec. 8, 1987

[54] FREQUENCY MULTIPLYING CIRCUIT

[75] Inventors: Herman W. Van Rumpt, Eindhoven, Netherlands; Charles J. H. Razzell, Cambridge, United Kingdom

[73] Assignee: U.S. Philips Corporation, New York, N.Y.

[21] Appl. No.: 658,834

[22] Filed: Oct. 9, 1984

[30] Foreign Application Priority Data

Oct. 7, 1983 [GB] United Kingdom ................. 8326823

[51] Int. Cl.$^4$ ........................... H03B 1/26; H03F 3/10
[52] U.S. Cl. ....................................... 328/160; 328/16; 328/167; 307/271; 307/494; 307/498; 307/529
[58] Field of Search ............... 307/529, 525, 271, 274, 307/494, 498, 478, 502, 252; 328/15, 160, 133, 156, 167, 16–18, 20

[56] References Cited

U.S. PATENT DOCUMENTS 3,210,564  10/1965  Rabinovici et al. .................. 307/274
4,025,872   5/1977  Grayzel .................................. 330/34
4,268,916   5/1981  Kusakabe .............................. 455/333

Primary Examiner—Stanley D. Miller
Assistant Examiner—Richard Roseen
Attorney, Agent, or Firm—Thomas A. Briody; Jack Oisher; William J. Streeter

[57] ABSTRACT

A frequency multiplying circuit comprises a differential amplifier formed by two transistors whose emitters are connected by a current source to a low voltage supply rail, collector resistors are connected to a higher voltage rail as is also done with the base electrode of one of the transistors, the base electrode of the other of the transistors has an oscillator connected thereto. An LC resonant circuit coupled between the collectors of the two transistors and is tuned to select either the basic frequency of the oscillator or an odd harmonic thereof.

In order to overcome problems of excessive damping of the resonant circuit due to the collector resistors of the differential amplifier being effectively in parallel therewith which damping is made worse when the load of the following stage is added, it was found that the frequency multiplying circuit could provide a high quality factor and low power consumption if the coupling between the differential amplifier and the resonant circuit is reduced and also if the effect of the load of the next following stage was overcome.

This is achieved by connecting a negative resistance circuit across the resonant circuit. The negative resistance circuit comprises a transistorized differential amplifier, the base electrodes of the transistors are cross connected to the collector of the other transistor, to form a negative conductance which is in parallel with the positive conductances which are causing the resonant circuit to be lossy. Hence the parallel loss conductance is reduced in value and the effective Q is increased.

5 Claims, 2 Drawing Figures

FREQUENCY MULTIPLYING CIRCUIT

The present invention relates to a frequency multiplying circuit.

Frequency multiplying circuits are known and normally comprise a resonant circuit in the output of an active element such as a junction transistor. In operation an input oscillatory signal is distorted so that at the output of the active element are produced the fundamental frequency and the harmonics thereof. The output frequency of the frequency multiplying circuit is selected by tuning the resonant circuit which generally includes an inductance formed by a transformer or a tapped coil which are also used for coupling the frequency multiplying circuit to the next following stage. The user of such inductances has a number of disadvantages in that if used with an integrated circuit then extra pins have to be provided. Inductors are relatively expensive compared to the cost of other components and the Q of the circuit is reduced due to driving a low impedance load formed by the next following stage. A drawback of having a low Q, especially in the high frequency parts of a circuit, is that the current consumption is high and this is particularly relevant when designing frequency multiplying circuits for battery operated portable radio equipment such as paging receivers.

SUMMARY OF THE INVENTION

An object of the present invention is to provide a frequency multiplier for use at radio frequencies at which the amplitude and quality factor are maintained to a high level without the need for excessive current consumption.

According to the present invention there is provided a frequency multiplying circuit comprising means for producing the fundamental frequency and harmonics of the frequency of an input signal, said means having outputs for connection to the next following stage, a frequency selecting circuit connected to said outputs for selecting a desired frequency in the signal produced thereacross and a negative resistance circuit connected to said outputs.

Further according to the present invention there is provided a frequency multiplying circuit comprising a differential amplifier circuit including first and second active elements of the same conductivity tape, an oscillator circuit connected to a control electrode of the first active element, a resonant circuit coupled between output electrodes of the first and second active elements, the resonant circuit being tunable to the oscillator frequency or to an odd harmonic thereof, an output being derived from across the ends of the resonant circuit, and a negative resistance circuit connected across the ends of the resonant circuit to reduce the damping effect of the load of the next following stage connected to the output.

The provision of the negative resistance circuit reduces the damping effect on the resonant circuit by the addition of the low load impedance of the next following stage and thus increases the Q. The high Q eliminates unwanted products in the output because the resonant circuit can be made more selective. Consequently the active elements are not driven so hard and this results in a lower current consumption than in the case of a low Q circuit.

A pure negative resistance is difficult to implement and in an embodiment of the present invention the negative resistance circuit comprises third and fourth active elements of the same conductivity type whose input electrodes are coupled together and to a current source, whose output electrodes are connected one to each side of the resonant circuit and whose control electrodes are cross connected to the output electrode of the other of the third and fourth active elements.

If desired resistive devices may be connected respectively between the input electrodes of the third and fourth active elements and the current source in order to provide a large signal linearity. However, the effect of adding these resistive devices is to increase the current consumption.

The output electrodes of the first and second active elements may be connected to the resonant circuit by respective resistors. The provision of these resistors reduces the coupling between differential amplifier and the tuned load and in consequence offsets some of the damping of the tuned circuit which occurs due to the addition of load of the next following stage.

The provision of resistors respectively between the output electrodes of the frequency multiplying circuit and one, +Vcc, of the power supply lines avoids the need to use a transformer or tapped coil to couple the frequency multiplying circuit to the next following stage.

If desired means may be provided for adjusting the amount of negative resistance so that the net resistance across the resonant circuit is negative and the circuit in response thereto forms an oscillator locked to the appropriate harmonic of the input frequency.

The first to fourth active elements may comprise semiconductor devices, for example junction transistors or MOS transistors, of the same conductivity type.

DESCRIPTION OF THE FIGURES

The present invention will now be described, by way of example, with reference to the accompanying drawings, wherein.

DESCRIPTION OF THE PREFERRED EMBODIMENT

Figure 1:
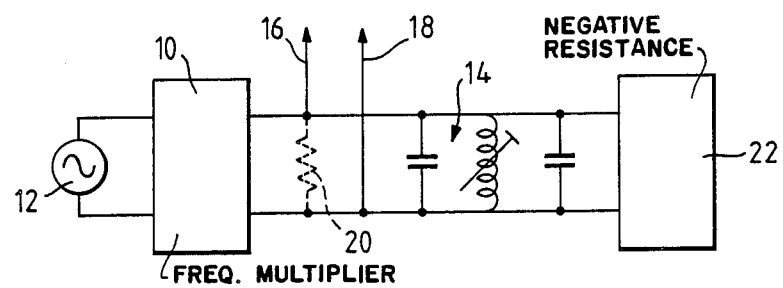
FIG. 1 is a block schematic circuit diagram of a frequency multiplying circuit made in accordance with the present invention.

The frequency multiplying circuit shown in FIGS. 1 comprises a frequency multiplier 10 to which an oscillator 12 is connected. The frequency multiplier 10 may comprise a limiting amplifier known as a hard limiter which produces an output signal which is enriched in the odd-numbered harmonics of the fundamental frequency of the oscillator 12. In order to select a particular harmonic such as the third harmonic, a tunable L.C. parallel resonant circuit 14 is connected to the output of the frequency multiplier 10.

A load (not shown) is connected to the outputs 16, 18 of the frequency multiplier 10. For convenience the load is represented in broken lines as a resistor 20 and included in the value of the resistor 20 is the resistance of the resonant circuit 14.

A problem with the circuit described so far is that with the addition of the next following stage (not shown), its resistive load is connected in parallel with the resonant circuit 14 and causes damping which leads to a reduced selectivity. In order to reduce this effect a negative resistance 22 is connected across the outputs 16, 18 so that the Q of the circuit is increased which in turn leads to a reduction in the power consumption.

Figure 2:
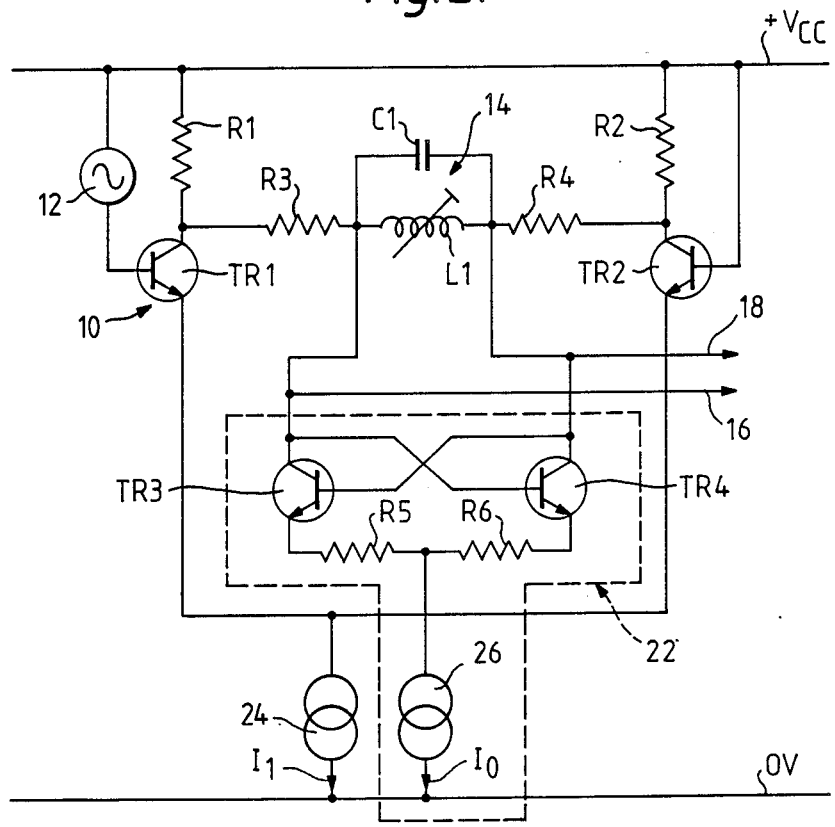
FIG. 2 is a schematic circuit diagram of an embodiment of the present invention.

The circuit shown in FIG. 2 is designed to provide an output signal of three times the input frequency and to drive the following stage with a different differential voltage of sufficient amplitude and spectral purity.

The frequency multiplier 10 comprises a differential amplifier circuit formed by the NPN transistors TR1 and TR2. The emitters of the transistors are connected together and are coupled by a current source 24 to a low voltage line. The collectors of the transistors TR1 and TR2 are connected to a positive voltage rail $+V_{cc}$ by resistors R1 and R2, respectively. An oscillator 12 providing an input frequency is connected between the positive supply line and the base of the transistor TR1. The base of the transistor TR2 is connected to the positive supply line $+V_{cc}$. A resonant circuit 14 comprising parallel connected inductance L1 and capacitance C1 is coupled by means of resistors R3 and R4 to the collectors of the transistors TR1 and TR2, respectively. An output from the differential amplifier is derived from across the resonant circuit 14 and is applied to output terminals 16, 18.

A negative resistance circuit 22 is connected across the output terminals 16, 18 and comprises differentially connected NPN transistors TR3 and TR4. More particularly, the collectors of the transistors TR3, TR4 are respectively connected to the junctions of the resonant circuit 14 with the resistors R3 and R4. The emitters of the transistors TR3, TR4 are connected by resistors R5, R6 to another current source 26 which is connected to the low voltage line. The base electrodes of the transistors TR3, TR4 are cross-connected to the collector of the other transistor TR4, TR3 of the differential amplifier to provide the negative resistance.

Ignoring the negative resistance circuit 22 for the moment, the remainder of the circuit operates as follows. The differential amplifier formed by the transistors TR1, TR2 acts as a clipping amplifier to signals of more than approximately 200 mV peak-to-peak. The differential voltage at the collectors of the transistors TR1, TR2 will thus approximate to a square wave containing the fundamental frequency as well as the odd harmonics of that frequency. The tunable resonant circuit 14 is adjusted to select a frequency which is to be applied to the output terminals 16, 18 in the present example the circuit 14 is tuned to the third harmonic of the frequency of the oscillator 12. A drawback to this arrangement is that the collector resistors R1, R2 of the differential amplifier are effectively arranged in parallel with the resonant circuit 14 and causes excessive damping of the resonant circuit. The damping is made worse when the load of the next following stage is added to the terminals 16, 18.

This reduction in damping can be overcome by reducing the coupling between the differential amplifier and the tuned circuit and overcoming the effects of the load resistance of the following stage by providing a negative resistance in the form of the circuit 22.

By connecting the resistors R3, R4 between each end of the resonant circuit 14 and the collectors of the transistors TR1, TR2 respectively, the coupling between the differential amplifier and the tuned circuit is reduced.

The connection of the resistors R1, R2 to either side of the inductance L1 via resistors R3 and R4 avoids the need to provide a transformer or tapped coil for deriving the output.

The negative resistance circuit is based on the fact that the base electrodes of the transistors TR3 and TR4 are cross-coupled so that the normal transconductance of the differential amplifier, transistors TR3, TR4, is used for a negative conductance of the same value that is:

$$g = -I_o/(4 \cdot V_t)$$

where $I_o$ is the tail current of the amplifier and Vt is the voltage equivalent of temperature which is given by $$V_t = k \cdot T/q$$

where k is Boltzmann's constant, $1.38 \times 10^{-23}$ J/°K, T is the absolute temperature and q the charge on an electron. Vt has a value approximately 25 mV at room temperature and thus the negative conductance for small signals is approximately:

$$g = -I_o/100 \text{ mV}.$$

In operation, the negative conductance produced is in parallel with the positive conductances which are causing the tuned circuit to be lossy. Hence the parallel loss conductance is reduced in value and the effective Q is increased.

In the circuit described so far the negative resistance is only effective in the linear region of the differential amplifier transfer function, that is, for differential signals of about 50 mV peak-to-peak. If it is desired for the circuit to handle larger signals then the active range of the negative resistance circuit can be increased by providing additional resistance in the emitter circuits of the transistors TR3 and TR4. Conveniently these extra emitter resistors are the resistors R5, R6. However, although a larger signal linearity is achieved compared to the situation when there is no additional emitter resistance present the undesirable effect of providing such resistors is that more current is required to achieve the same value of negative conductance.

If the amount of negative resistance is adjusted so that the net resistance across the resonant circuit 14 is negative, the frequency multiplier circuit now forms an oscillator locked to the appropriate harmonic of the input frequency.

If desired the circuit can be implemented using other types of transistors such as field effect devices such as gallium arsenide devices. Further in determining the level of the tail current $I_o$, it has to be selected to avoid the circuit 22 going into uncontrolled oscillation. Although the values of R1 to R4 can be calculated, in determining the values of R3 and R4 one has to aim at obtaining a good acceptable pulling range independent of temperature and obtaining a high Q for the resonant circuit when a load is connected to the output terminals 16 and 18. If the current $I_o$ is large and the current $I_1$ is small then there will be a tendency for the circuit to oscillate and have a small pulling range and conversely if $I_o$ is small and $I_1$ is large then the influence of the negative resistance is negligible. If the resistors R5 and R6 are provided then they will be of substantially equal value.

We claim:

1. A frequency multiplying circuit comprising a differential amplifier circuit including first and second active elements of the same conductivity type, each of said first and second active elements having a control electrode, an input electrode and an output electrode, an oscillator circuit connected to the control electrode of the first active element, a resonant circuit coupled between the output electrodes of the first and second active elements, the resonant circuit being tunable to the oscillator's frequency or to an odd harmonic thereof, an output being derived from ends of said resonant circuit, and a negative resistance circuit being connected across first and second ends of said resonant circuit to reduce the effect of a load of a following stage connected to the output, said negative resistance circuit comprising third and fourth active elements of the same conductivity type, each of said third and fourth active elements having an input electrode, an output electrode and a control electrode, a current source coupled to said input electrodes of the third and fourth active elements, the output electrodes of said third and fourth active elements are connected one to each end of the resonant circuit and the control electrodes of said third and fourth active elements are cross-connected to the output electrode of the other of the third and fourth active elements, and resistive devices connected respectively between the input electrodes of the third and fourth active elements and said current source.

2. A frequency multiplying circuit as claimed in claim 1, further comprising respective resistors connecting the output electrodes of said first and second active elements to said resonant circuit.

3. A frequency multiplying circuit as claimed in claim 2 or 1, further comprising means for adjusting the amount of negative resistance so that the net resistance across the resonant circuit is negative whereby an oscillator locked to an appropriate harmonic of the input frequency is formed.

4. A frequency multiplier circuit comprising:
a differential amplifier having first and second differentially connected transistors, said transistors having common emitter connections connected to a current source, independent collector connections connected to separate load resistors, and base connections connected to different ends of an input signal source;
a resonant circuit having a resonant frequency substantially equal to a multiple of the frequency of said input signal source coupled between said first and second transistors' collector connections, said resonant circuit supplying a multiplied frequency signal to an external load; and
a negative resistance circuit connected in parallel with said resonant circuit comprising third and fourth transistors having emitter connections connected to a second current source, collector connections connected to each end of said resonant circuit; and base connections of said third and fourth transistor connected to the collector of said fourth and third transistors, respectively, whereby the effect of an external load on said resonant circuit is reduced by said negative resistance circuit.

5. A frequency multiplier circuit comprising:
a differential amplifier connected to receive input signals having a frequency to be multiplied, said differential amplifier providing on two differential output terminals an amplitude limited differential output signal;
a resonant circuit having first and second ends coupled between said output terminals having a resonant frequency which is a multiple of said input signal frequency; said resonant circuit adapted to couple a frequency multiplied signal to an external load; and,
a negative resistance circuit connected in parallel with said resonant circuit, reducing the effect of said load on said resonant circuit Q factor, comprising:
a pair of transistors, each transistor having a base connection cross-coupled to a collector connection of the other transistor and to first and second ends of said resonant circuit; and emitter connections connected to a current source.

* * * * *